(12) United States Patent
Moon

(10) Patent No.: US 8,680,569 B2
(45) Date of Patent: Mar. 25, 2014

(54) METHOD FOR MANUFACTURING GALLIUM OXIDE BASED SUBSTRATE, LIGHT EMITTING DEVICE, AND METHOD FOR MANUFACTURING THE LIGHT EMITTING DEVICE

(75) Inventor: Yong Tae Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 25 days.

(21) Appl. No.: 13/355,042

(22) Filed: Jan. 20, 2012

(65) Prior Publication Data

US 2012/0119227 A1 May 17, 2012

Related U.S. Application Data

(63) Continuation of application No. 12/620,061, filed on Nov. 17, 2009, now Pat. No. 8,125,001.

(30) Foreign Application Priority Data

Nov. 17, 2008 (KR) ........................ 10-2008-0114144

(51) Int. Cl.
*H01L 33/00* (2010.01)

(52) U.S. Cl.
USPC ....... 257/103; 257/98; 257/101; 257/E33.002

(58) Field of Classification Search
USPC .............................. 257/98, 101, 103, E33.002
See application file for complete search history.

(56) References Cited

U.S. PATENT DOCUMENTS

| | | | |
|---|---|---|---|
| 7,319,249 B2 | 1/2008 | Ichinose et al. | |
| 7,438,762 B2 | 10/2008 | Kato et al. | |
| 8,125,001 B2 * | 2/2012 | Moon | 257/103 |
| 8,222,658 B2 | 7/2012 | Chinagawa et al. | |
| 2006/0223287 A1 | 10/2006 | Ushida et al. | |
| 2006/0289860 A1 | 12/2006 | Ichinose et al. | |
| 2007/0134833 A1 | 6/2007 | Ikemoto et al. | |
| 2008/0070337 A1 | 3/2008 | Ichinose et al. | |
| 2008/0258170 A1 | 10/2008 | Hsu | |
| 2009/0146161 A1 | 6/2009 | Miki et al. | |
| 2011/0253973 A1 | 10/2011 | Ichinose et al. | |

FOREIGN PATENT DOCUMENTS

| | | |
|---|---|---|
| CN | 1833310 A | 9/2006 |
| EP | 1 653 502 A1 | 5/2006 |
| JP | 2004-56098 A | 2/2004 |
| JP | 2005-64153 A | 3/2005 |
| JP | 2006-135269 A | 5/2006 |
| JP | 2006-310765 A | 11/2006 |
| JP | 2007-55850 A | 3/2007 |
| JP | 2007-137728 A | 6/2007 |
| JP | 2007-234902 A | 9/2007 |
| JP | 2008-270694 A | 11/2008 |
| JP | 2009-130013 A | 6/2009 |
| KR | 10-2006-0105546 A | 10/2006 |
| KR | 10-2008-0098550 A | 11/2008 |
| WO | WO 2008/029915 A1 | 3/2008 |

\* cited by examiner

*Primary Examiner* — Tan N Tran

(74) *Attorney, Agent, or Firm* — Birch, Stewart, Kolasch & Birch, LLP

(57) ABSTRACT

A light emitting device comprises a gallium oxide based substrate, a gallium oxynitride based layer on the gallium oxide based substrate, a first conductivity-type semiconductor layer on the gallium oxynitride based layer, an active layer on the first conductivity-type semiconductor layer, and a second conductivity-type semiconductor layer on the active layer.

19 Claims, 5 Drawing Sheets

METHOD FOR MANUFACTURING GALLIUM OXIDE BASED SUBSTRATE, LIGHT EMITTING DEVICE, AND METHOD FOR MANUFACTURING THE LIGHT EMITTING DEVICE

CROSS-REFERENCE TO RELATED APPLICATION

This application is a continuation of U.S. application Ser. No. 12/620,061 filed on Nov. 17, 2009 now U.S. Pat. No. 8,125,001 claiming the benefit of Korean Patent Application No. 10-2008-0114144 filed on Nov. 17, 2008, both of which are hereby incorporated by reference for all purpose as if fully set forth herein.

BACKGROUND

The present disclosure relates to a method for manufacturing a gallium oxide based substrate, a light emitting device, and a method for manufacturing the light emitting device.

Nitride semiconductors attract a great attention in the optical device and high-power electronic device development fields because of their high thermal stability and wide bandgap energy. In particular, blue, green and UV light emitting devices using nitride semiconductors have been commercialized and widely used.

Nitride semiconductor light emitting devices include a nitride semiconductor layer that is organic-chemically deposited over a sapphire substrate being a dissimilar substrate.

The sapphire substrate has an electrically insulating characteristic. Thus, in order to apply a voltage to the nitride semiconductor layer, it is necessary to partially etch the nitride semiconductor layer or remove the sapphire substrate.

The nitride semiconductor light emitting devices may be classified into lateral type nitride semiconductor light emitting devices and vertical type nitride semiconductor light emitting devices according to position of an electrode layer.

In the case of the lateral type nitride semiconductor light emitting devices, a nitride semiconductor layer is formed over the sapphire substrate, and two electrode layers are formed to be arranged over the nitride semiconductor layer.

In the case of the vertical type nitride semiconductor light emitting devices, a nitride semiconductor layer is formed over the sapphire substrate, the sapphire substrate is separated from the nitride semiconductor layer, and two electrode layers are formed to be arranged on and under the nitride semiconductor layer, respectively.

Meanwhile, the lateral type nitride semiconductor light emitting devices need to remove a portion of the nitride semiconductor layer in order to form two electrode layers, and has limitations in that the reliability and efficiency of light emission characteristic are degraded because of non-uniform current distribution.

Furthermore, the vertical type nitride semiconductor light emitting devices need to separate the sapphire substrate.

Therefore, many researches have been made on vertical type nitride semiconductor light emitting devices, in particular, nitride semiconductor light emitting devices that need not separate the substrate by the use of conductive substrates.

SUMMARY

Embodiments provide a method for manufacturing a gallium oxide based substrate, a light emitting device, and a method for manufacturing the light emitting device.

Embodiments provide a method for manufacturing a gallium oxide based substrate, which is capable of forming a high-quality nitride semiconductor layer, a light emitting device, and a method for manufacturing the light emitting device.

In an embodiment, a light emitting device comprises: a gallium oxide based substrate; a gallium oxynitride based layer on the gallium oxide based substrate; a first conductivity-type semiconductor layer on the gallium oxynitride based layer; an active layer on the first conductivity-type semiconductor layer; and a second conductivity-type semiconductor layer on the active layer.

In an embodiment, a method for manufacturing a gallium oxide based substrate comprises: preparing a gallium oxide based substrate; and performing a thermal treatment on the gallium oxide based substrate in an oxygen atmosphere.

In an embodiment, a method for manufacturing a light emitting device comprises: preparing a gallium oxide based substrate; forming a gallium oxynitride based layer on the gallium oxide based substrate; forming a first conductivity-type semiconductor layer on the gallium oxynitride based layer; forming an active layer on the first conductivity-type semiconductor layer; and forming a second conductivity-type semiconductor layer on the active layer.

DETAILED DESCRIPTION OF THE EMBODIMENTS

Figure 1:
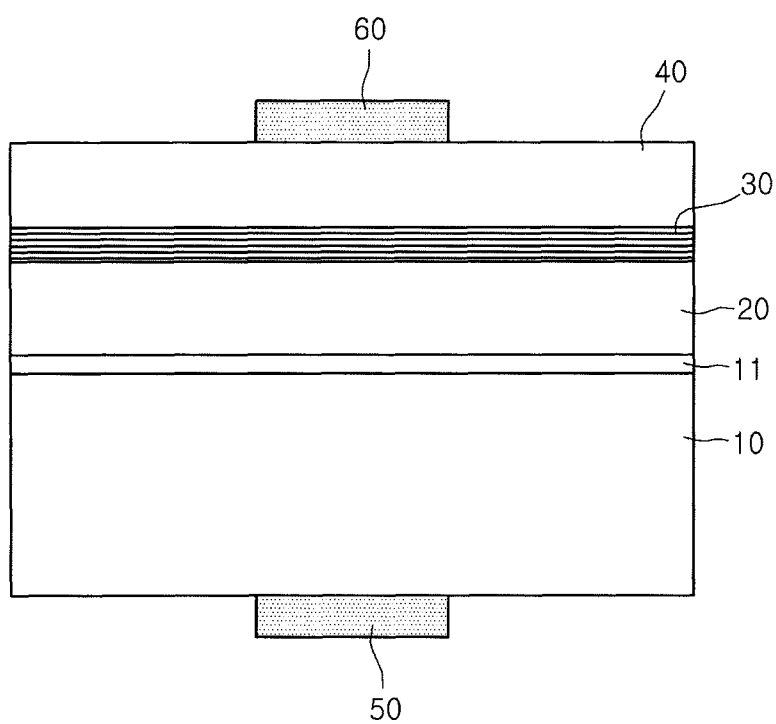
FIG. 1 is a sectional view for explaining a method for manufacturing a gallium oxide based substrate, and a light emitting device manufactured by a method for manufacturing a light emitting device according to an embodiment.

Reference will now be made in detail to the embodiments of the present disclosure, examples of which are illustrated in the accompanying drawings.

In the description of embodiments, it will be understood that when a layer (or film), region, pattern or structure is referred to as being 'another' layer (or film), region, pad or pattern, the terminology of "on" and "under" includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

FIG. 1 is a sectional view for explaining a method for manufacturing a gallium oxide based substrate, and a light emitting device manufactured by a method for manufacturing a light emitting device according to an embodiment.

Referring to FIG. 1, a first conductivity-type semiconductor layer 20, an active layer 30, and a second conductivity-type semiconductor layer 40 are formed on a gallium oxide based substrate 10. A first electrode layer 50 is disposed under the gallium oxide based substrate 10, and a second electrode layer 60 is disposed on the second conductivity-type semiconductor layer 40.

Furthermore, a gallium oxynitride based layer 11 may be formed between the gallium oxide based substrate 10 and the first conductivity-type semiconductor layer 20.

The gallium oxide based substrate 10 may be formed of gallium oxide ($Ga_2O_3$) and may have excellent electrical conductivity due to impurity doping.

Also, the gallium oxide based substrate 10 may be formed of one of $(InGa)_2O_3$, $(AlGa)_2O_3$, or $(InAlGa)_2O_3$.

The first conductivity-type semiconductor layer 20 may be an n-type semiconductor layer. For example, the first conductivity-type semiconductor layer 20 may be a gallium nitride (GaN) based layer into which n-type impurities are doped.

Also, the n-type semiconductor layer may be formed of one of InGaN, AlGaN, InAlGaN, AlInN, AlGaN/GaN SPS (short-period superlattice), or AlGaN/AlGaN SPS (short-period superlattice) into which n-type impurities are doped.

The active layer 30 is a layer in which electrons and holes from the first conductivity-type semiconductor layer 20 and the second conductivity-type semiconductor layer 40 are recombined to emit light. The active layer 30 may include a barrier layer and a well layer. For example, the active layer 30 may be a gallium nitride layer or an indium-containing gallium nitride layer.

Also, the active layer 30 may be formed of one of InGaN/GaN, InGaN/InGaN, or InGaN/AlGaN.

The second conductivity-type semiconductor layer 40 may be a p-type semiconductor layer. For example, the second conductivity-type semiconductor layer 40 may be a gallium nitride based layer into which p-type impurities are doped.

Also, the p-type semiconductor layer may be formed of one of InGaN, AlGaN, InAlGaN, AlInN, AlGaN/GaN SPS (short-period superlattice), or AlGaN/AlGaN SPS (short-period superlattice) into which n-type impurities are doped.

The first electrode layer 50 and the second electrode layer 60 may be formed of a conductive material such as a metal.

The structure of the light emitting device illustrated in FIG. 1 is merely exemplary, and the present invention is not limited thereto. In manufacturing the light emitting device, another semiconductor layer that is not described in FIG. 1 may be further included between the semiconductor layers illustrated in FIG. 1. For example, an n-type semiconductor layer may further be formed between the second conductivity-type semiconductor layer 40 and the second electrode layer 60.

Meanwhile, gallium oxide is thermodynamically unstable and mechanically vulnerable at high temperature.

The crystal structure of gallium oxide is a monoclinic system and has a strong cleavage characteristic with respect to a specific crystal plane, that is, (100) plane and (001) plane. Thus, when gallium oxide is manufactured in a thin film form, layers are easily separated and the surface treatment is difficult.

Therefore, in accordance with an embodiment, the gallium nitride based layer can be grown on the gallium oxide based substrate 10 into a high-quality thin film through the surface treatment of the gallium based de substrate 10.

Figure 2:
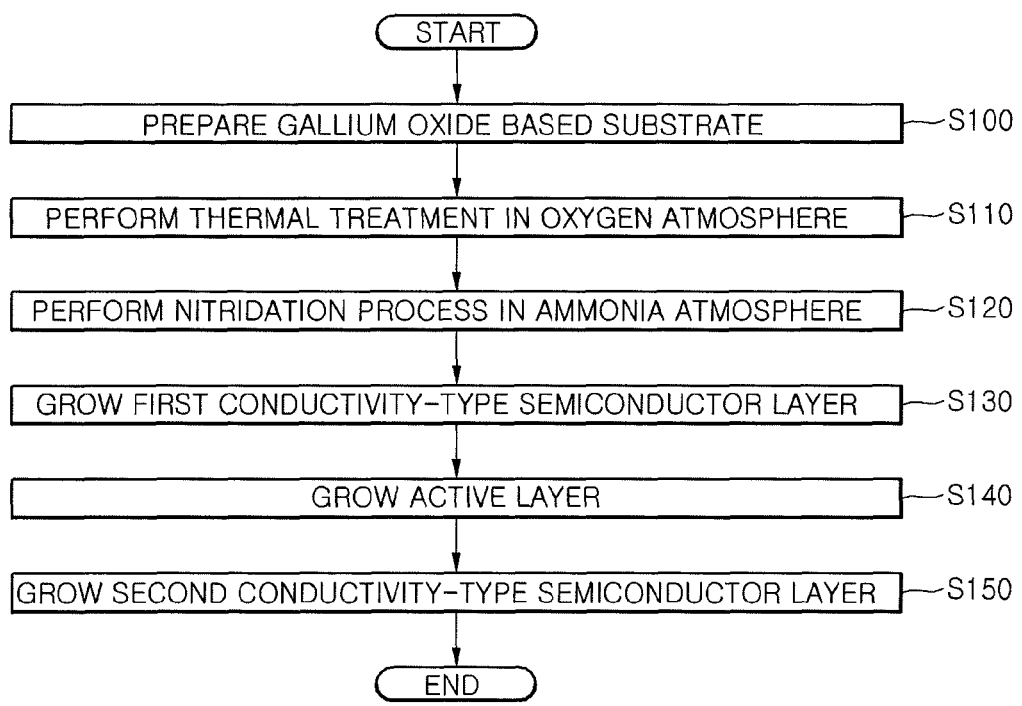
FIG. 2 is a flowchart illustrating a method for manufacturing a light emitting device according to an embodiment.

FIG. 2 is a flowchart illustrating a method for manufacturing a light emitting device according to an embodiment.

Referring to FIG. 2, a gallium oxide based substrate 10 is prepared (S100). The gallium oxide based substrate 10 may be a gallium oxide based substrate into which first conductivity-type impurities such as silicon (Si) are doped in order to improve the electrical conductivity.

A wet cleaning is performed on the gallium oxide based substrate 10 to remove organic material or inorganic material remaining on the gallium oxide based substrate 10. For example, in the wet cleaning, an acid cleaning may be performed after an organic cleaning.

The organic cleaning is to remove foreign materials from the gallium oxide based substrate 10 by using acetone and methanol, and the acid cleaning is to remove gallium oxide particles existing on the gallium oxide based substrate 10 in a protrusion shape by using fluoric acid, sulfuric acid, and hydrogen peroxide.

For example, as the organic cleaning method, the gallium oxide based substrate 10 is dipped into acetone and methanol, an ultrasonic cleaning is performed for three minutes, and then, an ultrasonic cleaning is performed with deionized water for three minutes.

Meanwhile, the gallium oxide based substrate 10 is made by mechanically cut gallium oxide crystal ingot into a predetermined size and in a predetermined crystal direction. Therefore, surface scratch is formed on the surface of the gallium oxide based substrate 10 during the cutting process.

Figure 3:
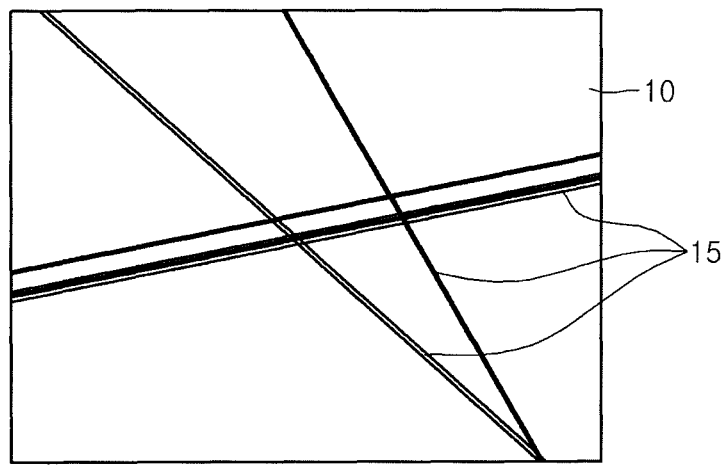
FIG. 3 is a diagram for explaining surface scratches of a gallium oxide based substrate.

FIG. 3 is a diagram for explaining surface scratches of the gallium oxide based substrate. It can be seen from FIG. 3 that many surface scratches 15 occur in the gallium oxide based substrate 10.

If the gallium nitride based layer is formed on the gallium oxide based substrate 10 with the surface scratches 15, a high-quality gallium nitride based layer cannot be obtained. Such surface scratches 15 are not removed by the wet cleaning.

Figure 4:
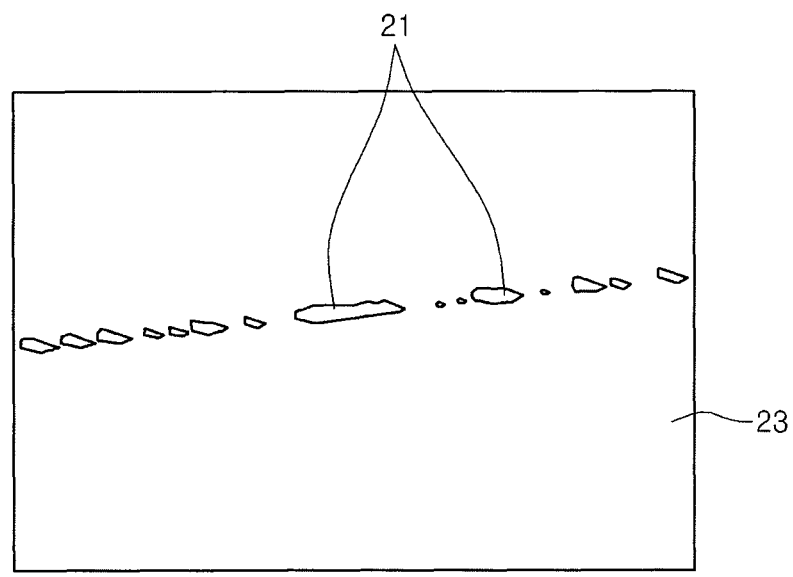
FIGS. 4 and 5 are diagrams for explaining the surface of the gallium nitride based layer grown to 100 nm thick on the scratched gallium oxide based substrate.
Figure 5:
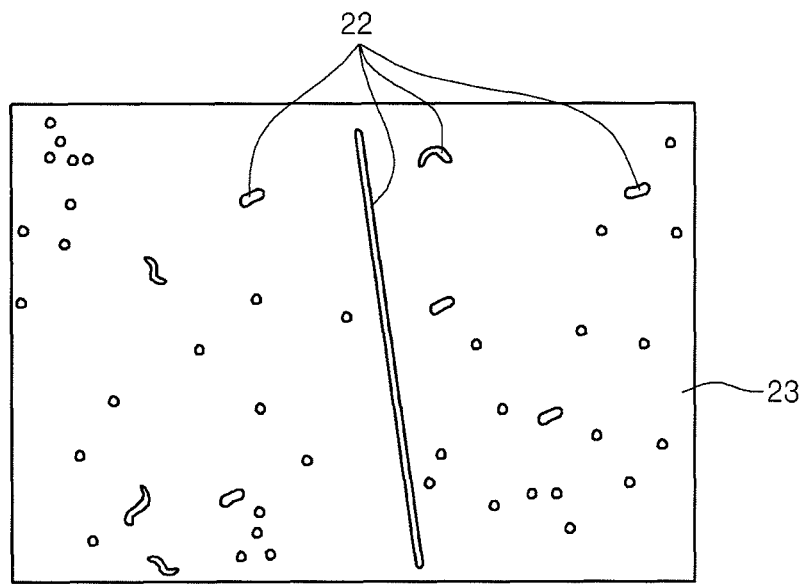

FIGS. 4 and 5 are diagrams for explaining the surface of the gallium nitride based layer 23 grown to 100 nm thick on the scratched gallium oxide based substrate.

FIG. 4 illustrates a gallium nitride based pattern 21 having a different phase from its periphery and having a protrusion shape on the surface of the gallium nitride based layer 23, and FIG. 5 illustrates a gallium nitride based pattern 22 having a valley-like recessed shape on the surface of the gallium nitride based layer 23 because the growth rate is retarded compared with its periphery.

As illustrated in FIGS. 4 and 5, the surface shape of the gallium nitride based layer 23 is determined according to the shape of the surface scratches of the gallium oxide based substrate 10.

Meanwhile, in order to grow the high-quality gallium nitride based layer on the gallium oxide based substrate 10, it is necessary to remove the surface scratches 15 of the gallium oxide based substrate 10.

Referring again to FIG. 2, according to the embodiment, the thermal treatment is performed on the gallium oxide based substrate 10 in an oxygen atmosphere in order to remove the surface scratches occurring on the surface of the gallium oxide based substrate 10.

That is, an oxygen gas or mixed gas containing oxygen gas as a main gas is injected into a chamber, and the thermal treatment is performed on the gallium oxide based substrate 10 at a temperature of 900-1400° C. for three minutes to three hours. In this case, when the thermal treatment temperature is high, the thermal treatment is performed for a short time. On the contrary, when the thermal treatment temperature is low, the thermal treatment is performed for a long time.

For example, according to a method of performing the thermal treatment in the oxygen atmosphere, the gallium oxide based substrate 10 is put into the chamber, and the temperature of the chamber is increased to 1100° C. while supplying high-purity oxygen gas into the chamber at a flow rate of 5 slm, and then, a high-temperature oxygen thermal treatment is performed for one hour. The wet cleaning may be again performed on the gallium oxide based substrate 10 that has been thermally treated in the oxygen atmosphere.

If the thermal treatment is performed on the gallium oxide based substrate 10, atoms on the surface of the gallium oxide based substrate 10 are thermally migrated to the most thermally stable position, so that surface atoms are rearranged. Therefore, the surface scratches 15 of the gallium oxide based substrate 10 can be healed.

Meanwhile, since the melting point of gallium oxide is 1725° C., if the thermal treatment is performed at a temperature higher than 1400° C., crystal atoms on the surface of the gallium oxide based substrate 10 are thermally molten and evaporated, and thus, the characteristics of the surface of the gallium oxide based substrate 10 is degraded. If the thermal treatment is performed at a temperature lower than 900° C., the surface scratches 15 cannot be effectively healed because of a low mobility of the crystal atoms on the surface of the gallium oxide based substrate 10.

Figure 6:
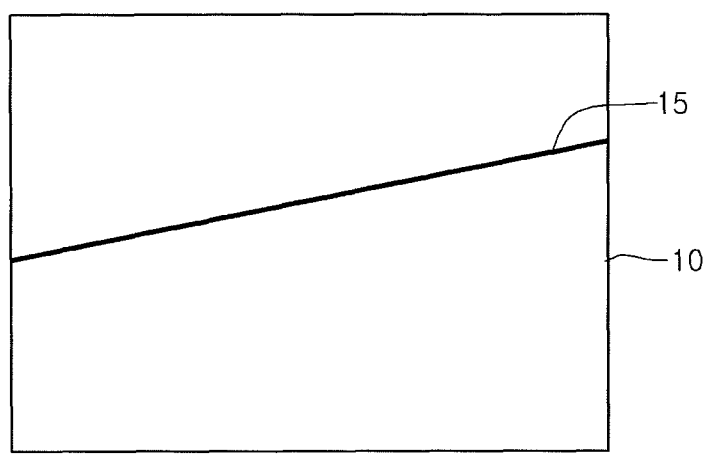
FIG. 6 illustrates the surface of the gallium oxide based substrate after the thermal treatment is performed on the gallium oxide based substrate in an oxygen atmosphere.

FIG. 6 illustrates the surface of the gallium oxide based substrate after the thermal treatment is performed on the gallium oxide based substrate in an oxygen atmosphere.

It can be seen from FIG. 6 that when the thermal treatment is performed on the gallium oxide based substrate 10 in an oxygen atmosphere, most surface scratches 15 of the gallium oxide based substrate 10 are healed and only slight impressions remain.

Figure 7:
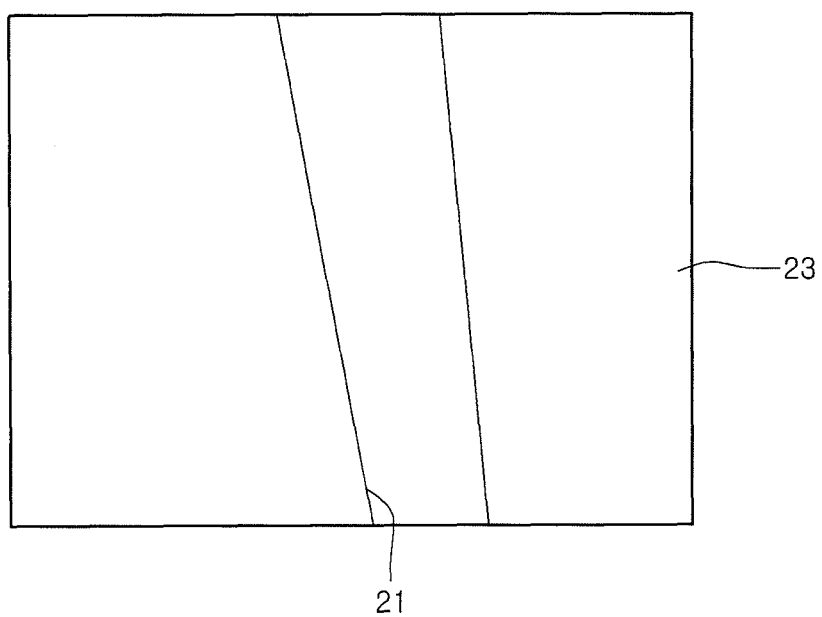
FIG. 7 illustrates the surface of the gallium nitride based layer grown to 100 m thick on the gallium oxide based substrate that has been thermally treated in an oxygen atmosphere.

FIG. 7 illustrates the surface of the gallium nitride based layer grown to 100 nm thick on the gallium oxide based substrate that has been thermally treated in an oxygen atmosphere.

Compared with FIGS. 4 and 5, most impressions caused by the surface scratches on the surface of the gallium nitride based layer 23 are removed and the gallium nitride based pattern 21 slightly remains.

Referring again to FIG. 2, the thermal treatment is performed on the gallium oxide based substrate 10 in an oxygen atmosphere, and then, high-temperature nitridation treatment is selectively performed on the gallium oxide based substrate 10 in an ammonia atmosphere (S120).

The high-temperature nitridation process may be performed by injecting ammonia gas, a mixed gas of ammonia gas and oxygen gas, or a mixed gas of ammonia gas and nitrogen gas into the chamber.

Through the high-temperature nitridation process, a gallium oxynitride based layer 11 is formed on the gallium oxide based substrate 10. The gallium oxynitride based layer 11 may serve as a buffer layer of a gallium nitride based layer, which will be grown later, and makes it possible to form a high-quality gallium nitride based layer on the gallium oxide based substrate 10.

In this case, the electrical conductivity of the gallium oxynitride based layer 11 can be improved by supplying a silicon-containing gas such as silane gas to the gas injected into the chamber.

Then, a first conductivity-type semiconductor layer 20 is grown on the gallium oxynitride based layer 11 (S130), an active layer 30 is grown on the first conductivity-type semiconductor layer 20 (S140), and a second conductivity-type semiconductor layer 40 is grown on the active layer 30 (S150).

For example, the first conductivity-type semiconductor layer 20 may be formed by injecting trimethylgallium (TMGa) gas, ammonia gas ($NH_3$), nitrogen gas ($N_2$), and silane gas ($SiH_4$) containing n-type impurity such as silicon (Si) into the chamber.

Furthermore, the active layer 30 may be formed in a multiple quantum well structure having InGaN/GaN structure by injecting trimethylgallium (TMGa) gas, ammonia gas ($NH_3$), nitrogen gas ($N_2$), and trimethylindium (TMIn) gas.

Moreover, the second conductivity-type semiconductor layer 40 may be formed by injecting trimethylgallium (TMGa) gas, ammonia gas ($NH_3$), nitrogen gas ($N_2$), and bis(ethylcyclopentadienyl)magnesium ($EtCp_2Mg$) {Mg$(C_2H_5C_5H_4)_2$} into the chamber.

A first electrode layer 50 is formed below the gallium oxide based substrate 10, and a second electrode 60 is formed on the second conductivity-type semiconductor layer 40.

As mentioned above, according to the embodiment, the gallium nitride based layer grown on the gallium oxide based substrate 10 can be formed with high quality by the surface treatment of the gallium oxide based substrate 10.

Furthermore, the gallium nitride based layer grown on the gallium oxide based substrate 10 can be formed with higher quality by forming the gallium oxynitride based layer 11 on the surface of the gallium oxide based substrate 10.

Moreover, the electrical conductivity of the gallium oxynitride based layer 11 can be further improved by injecting the impurities into the gallium oxynitride based layer 11.

By forming the nitride semiconductor layer on the substrate having the electrical conductivity through those procedures, the vertical type light emitting devices can be manufactured without removal of the substrate.

Embodiments provide a method for manufacturing a gallium oxide based substrate, a light emitting device, and a method for manufacturing the light emitting device.

Embodiments provide a method for manufacturing a gallium oxide based substrate, which is capable of forming a high-quality nitride semiconductor layer, a light emitting device, and a method for manufacturing the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a gallium oxide based substrate;
a first conductivity-type semiconductor layer on the gallium oxide based substrate;

an active layer on the first conductivity-type semiconductor layer; and a second conductivity-type semiconductor layer on the active layer, wherein the gallium oxide based substrate contains first conductivity-type impurities.

2. The light emitting device according to claim 1, further comprising a gallium oxynitride based layer on the gallium oxide based substrate.

3. The light emitting device according to claim 2, wherein the gallium oxynitride based layer and the gallium oxide based substrate contain the same conductivity-type impurities.

4. The light emitting device according to claim 2, wherein the gallium oxynitride based layer comprises the first conductivity-type impurities.

5. The light emitting device according to claim 1, further comprising:
- a first electrode layer under the gallium oxide based substrate; and
- a second electrode layer on the second conductivity-type semiconductor layer.

6. The light emitting device according to claim 1, wherein the first conductivity-type semiconductor layer comprises a gallium nitride based layer containing n-type impurities.

7. The light emitting device according to claim 1, wherein the second conductivity-type semiconductor layer comprises a gallium nitride based layer containing p-type impurities.

8. The light emitting device according to claim 1, wherein the active layer comprises a gallium nitride based layer.

9. The light emitting device according to claim 1, wherein the active layer is an indium-containing gallium nitride based layer.

10. The light emitting device according to claim 1, wherein a surface of the gallium oxide based substrate is essentially free of scratches.

11. The light emitting device according to claim 1, wherein the gallium oxide based substrate is formed by performing a thermal treatment on the gallium oxide based substrate in an oxygen atmosphere.

12. A light emitting device, comprising:
- a gallium oxide based substrate;
- a gallium oxynitride based layer on the gallium oxide based substrate; and
- a first conductivity-type semiconductor layer on the gallium oxynitride based layer, wherein the gallium oxynitride based layer and the gallium oxide based substrate contain the same conductivity-type impurities.

13. The light emitting device according to claim 12, further comprising an active layer on the first conductivity-type semiconductor layer; and a second conductivity-type semiconductor layer on the active layer.

14. The light emitting device according to claim 13, wherein the second conductivity-type semiconductor layer comprises a gallium nitride based layer containing p-type impurities.

15. The light emitting device according to claim 12, wherein the gallium oxynitride based layer comprises first conductivity-type impurities.

16. The light emitting device according to claim 12, wherein the gallium oxide based substrate contains first conductivity-type impurities.

17. The light emitting device according to claim 12, wherein the first conductivity-type semiconductor layer comprises a gallium nitride based layer containing n-type impurities.

18. The light emitting device according to claim 12, wherein a surface of the gallium oxide based substrate is essentially free of scratches.

19. The light emitting device according to claim 12, wherein the gallium oxide based substrate is formed by performing a thermal treatment on the gallium oxide based substrate in an oxygen atmosphere.

* * * * *